(12) United States Patent
Speasl et al.

(10) Patent No.: US 7,156,129 B2
(45) Date of Patent: *Jan. 2, 2007

(54) TRANSPORTABLE CONTAINER INCLUDING AN INTERNAL ENVIRONMENT MONITOR

(75) Inventors: Jerry A. Speasl, Pleasanton, CA (US); Edward Dante, Pleasanton, CA (US)

(73) Assignee: Entegris, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/146,936

(22) Filed: Jun. 7, 2005

(65) Prior Publication Data

US 2005/0284535 A1    Dec. 29, 2005

Related U.S. Application Data

(63) Continuation of application No. 10/042,849, filed on Jan. 8, 2002, now Pat. No. 6,901,971.

(60) Provisional application No. 60/261,035, filed on Jan. 10, 2001.

(51) Int. Cl.
*B65B 1/30* (2006.01)

(52) U.S. Cl. .................. 141/83; 141/11; 141/94; 141/98; 414/940

(58) Field of Classification Search ............ 141/1, 141/4, 11, 63, 69, 70, 83, 85, 94, 98; 414/935–941, 414/217.1; 206/710–712, 454; 700/121, 700/228, 229
See application file for complete search history.

(56) References Cited

U.S. PATENT DOCUMENTS

| | | | |
|---|---|---|---|
| 4,532,970 A | 8/1985 | Tullis et al. | |
| 4,534,389 A | 8/1985 | Tullis | |
| 4,724,874 A * | 2/1988 | Parikh et al. | 141/98 |
| 4,827,110 A | 5/1989 | Rossi et al. | |
| 4,888,473 A | 12/1989 | Rossi et al. | |
| 4,974,166 A | 11/1990 | Maney et al. | |
| 5,097,421 A | 3/1992 | Maney et al. | |
| 5,166,884 A | 11/1992 | Maney et al. | |
| 5,339,074 A | 8/1994 | Shindley et al. | |
| 5,351,415 A | 10/1994 | Brooks et al. | |
| 6,098,809 A | 8/2000 | Okada et al. | |
| 6,418,979 B1 | 7/2002 | Lewis et al. | |

* cited by examiner

*Primary Examiner*—Timothy L. Maust
(74) *Attorney, Agent, or Firm*—Patterson, Thuente, Skaar & Christensen, P.A.

(57) ABSTRACT

A system is disclosed allowing non-invasive, continuous local and remote sensing of the internal environmental characteristics of transportable containers. The system utilizes a variety of sensors inside the container to sense internal environmental conditions.

14 Claims, 5 Drawing Sheets

TRANSPORTABLE CONTAINER INCLUDING AN INTERNAL ENVIRONMENT MONITOR

CLAIM OF PRIORITY

This application is a continuation application, under 37 C.F.R. § 1.53(b), of pending prior application Ser. No. 10/042,849, filed Jan. 8, 2002 now U.S. Pat. No. 6,901,971 for: TRANSPORTABLE CONTAINER INCLUDING AN INTERNAL ENVIRONMENT MONITOR by: Jerry A. Speasl and Edward Dante, which claims priority to U.S. Provisional Application No. 60/261,035, filed Jan. 10, 2001 for: SMART POD INCLUDING ONBOARD MONITORING SYSTEM. The entire disclosure of the prior applications are considered as being part of the disclosure of the accompanying application and is hereby incorporated by reference therein.

BACKGROUND

1. Field of the Invention

The present invention relates to the manufacture of semiconductor wafers, and in particular to a system allowing non-invasive, continuous local and remote sensing of the internal environmental characteristics of transportable containers.

2. Description of Related Art

A Standard Mechanical Interface ("SMIF") system proposed by the Hewlett-Packard Company is disclosed in U.S. Pat. Nos. 4,532,970 and 4,534,389. The purpose of a SMIF system is to reduce particle fluxes onto semiconductor wafers ("wafers") during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient atmosphere do not enter the immediate wafer environment. This environment may be referred to herein as a "clean environment."

A SMIF system has three main components: (1) sealed pods used for storing and transporting wafers and/or wafer cassettes; (2) an input/output (I/O) minienvironment located on a semiconductor processing tool to provide a clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to contaminants. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Figure 1A:
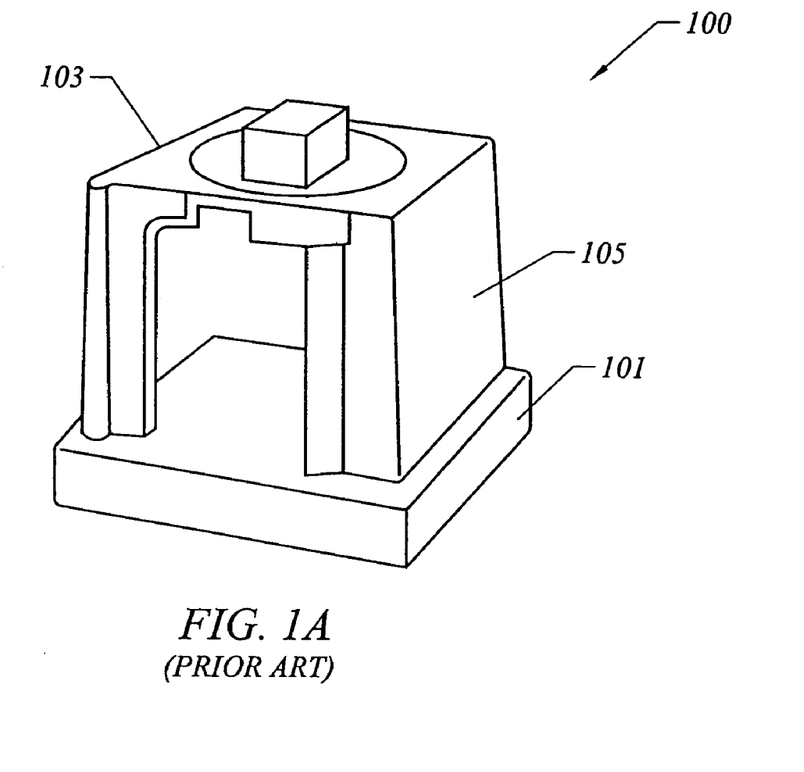
FIG. 1A is a schematic view of a bottom opening pod.
Figure 1B:
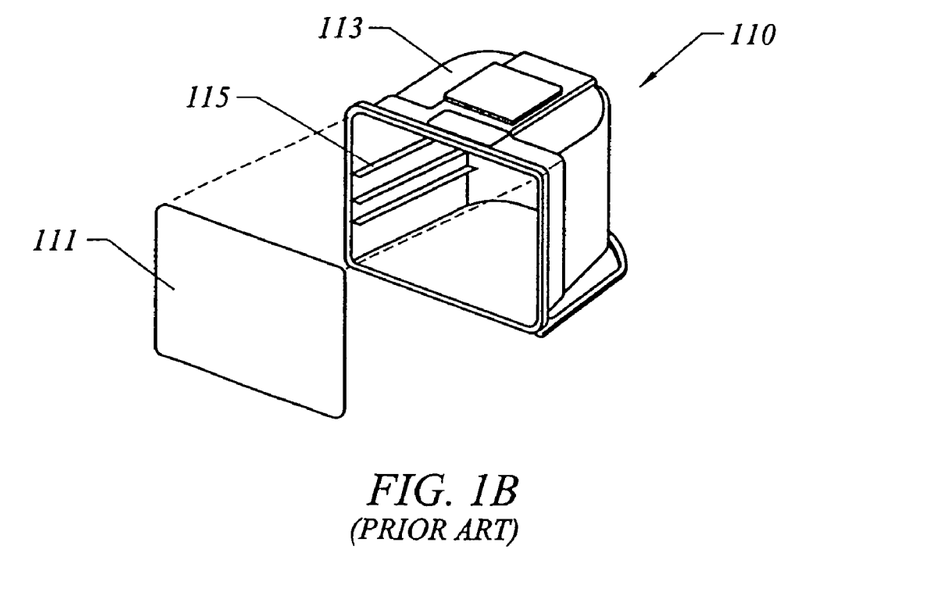
FIG. 1B is a schematic view of a front opening pod.

SMIF pods are in general comprised of a pod door which mates with a pod shell to provide a sealed environment in which wafers may be stored and transferred. "Bottom opening" pods 100, as illustrated in FIG. 1A, are pods where the pod door 101 is horizontally provided at the bottom of the pod 100 and mates to pod shell 103. The wafers are supported in a cassette 105 which is in turn supported on the pod door 101. "Front opening" pods 110 as illustrated in FIG. 1B, also referred to as front opening unified pods, or FOUPs, include a pod door 111 that is located in a vertical plane and mates with pod shell 113. The wafers (not shown) are supported either in a cassette (not shown) mounted within the pod shell 113, or to shelves 115 mounted within the pod shell 113.

In order to transfer wafers between a bottom opening or front opening pod and a process tool 505 (FIG. 5) within a wafer fabrication facility, the pod is typically loaded either manually or automatedly onto a load port assembly 507 (FIG. 5) which is typically either mounted to, or part of the process tool 505. The load port assembly 507 includes an access port which, in the absence of a pod, is covered by a port door (not shown). Upon loading of the pod on the load port assembly 507, the pod door aligns against the port door in both bottom opening and front opening systems.

Figure 5:
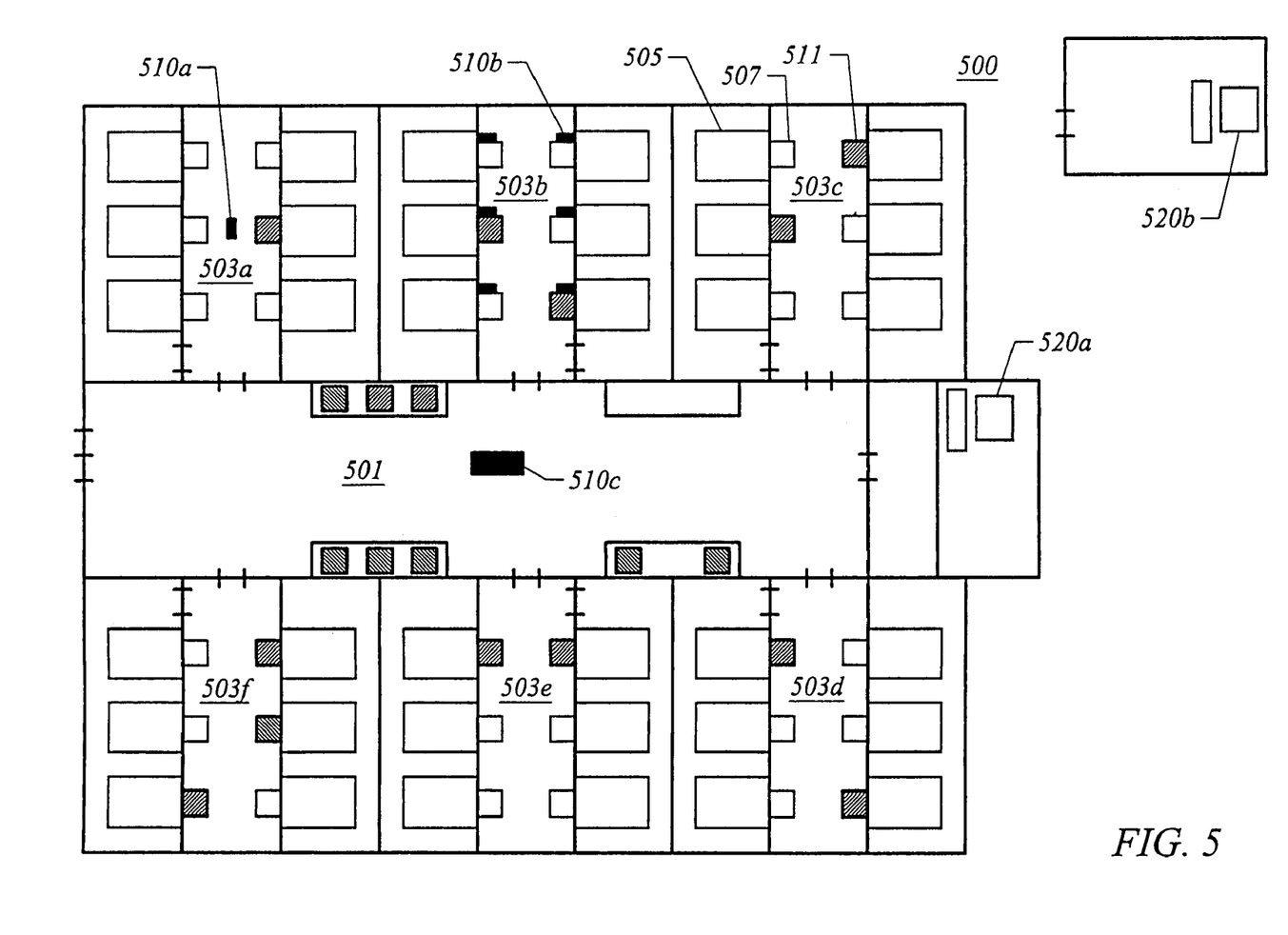

Once the pod is positioned on the load port assembly 507, mechanisms within the port door unlatch the pod door from the pod shell and move the pod door and port door to a position which allows access to the wafers by the processing tool 405. The pod shell remains in proximity to the now exposed access port so as to maintain a clean environment that includes the interior of the process tool and the pod shell.

In bottom opening systems, the port door, with the pod door 101 and wafer-carrying cassette 105 supported thereon, is lowered into the load port assembly 507. A wafer handling robot within the load port assembly 507 or process tool 505 may thereafter access particular wafers from the cassette for transfer between the cassette and the process tool. In front opening systems, the wafer handling robot may access the wafers directly from the pod shell 113 for transfer between the pod 110 and the process tool 505.

Systems of the above type protect against particle contamination of the wafers. Particles can be very damaging in semiconductor processing because of the small geometries employed in fabricating semiconductor devices. Typical advanced semiconductor processes today employ geometries which are one-half μm and under. Unwanted contamination particles which have geometries measuring greater than 0.1 μm substantially interfere with 1 μm geometry semiconductor devices. The trend, of course, is to have smaller and smaller semiconductor device geometries which today in research and development laboratories approach 0.1 μm and below.

As device geometries continue to shrink, contamination particles and molecular contaminants have become an important concern in semiconductor manufacture. There are several sources that cause contamination of semiconductor wafers as they travel through a fabrication process. For example, during a manufacturing process, certain gases, fluids, pressures, coherent and incoherent light, vibrations, electrostatic charge, and contaminants may affect the final yield of semiconductors. Therefore, it is important to control each of these parameters within a pod during the fabrication process.

Sealing the environment within a pod in accordance with SMIF technology discussed above has markedly improved a manufacturer's ability to control the environment surrounding semiconductor wafers. However, pods are frequently opened, both automatically at load port assemblies for wafer transfer, and manually by technicians, for example during pod cleaning. Moreover, pods often include valves for allowing the transfer of fluids to and from the sealed pod. Each of these operations and pod features can be potential sources of contaminants to semiconductor wafers within a pod.

It is known to perform wafer lot testing, where random or problem pods are selected for internal environmental characteristic testing during or after device formation on the wafers. While such operations are capable of identifying problems after they occur, known testing systems are not intended to pinpoint the time or location at which the problems occur. Thus, such testing operations are often performed too late to prevent contamination to a wafer lot. Moreover, where a contaminated pod is allowed to continue through the fabrication process, it often contaminates other processing tools and wafer lots. Further still, conventional testing operations are not intended to identify the areas within the fabrication facility which are introducing contaminants to the wafers.

Accordingly, there is a desire to provide an apparatus and method for actively monitoring the environment within a pod and processing stations.

SUMMARY OF THE INVENTION

The invention, roughly described, comprises a transportable container having an internal environment isolated from ambient atmospheric conditions. The transportable container includes a sensor for monitoring a condition of the internal environmental characteristic within the pod and transmitting data representative of the monitored condition. The transportable container may also include a power supply for providing power to the sensor.

In a further aspect, a transportable container monitoring system for monitoring an internal environmental condition of a transportable container having an internal environment isolated from ambient atmospheric conditions is provided. The transportable container monitoring system includes a sensor for monitoring the internal environmental condition within the container and transmitting data representative of the monitored condition. The system may also include, a transceiver in communication with the sensor for receiving and transmitting data transmitted by the sensor.

According to another aspect, a transportable container having an internal environment isolated from ambient atmospheric conditions is provided. The transportable container includes a plurality of sensors, each sensor monitoring a distinct internal environmental condition within the transportable container and transmits data representative of the monitored condition. A transceiver may also be included in the transportable container, which receives and transmits the data transmitted from the sensors.

According to still another aspect, a sensor network for monitoring internal environment conditions within a transportable container is provided. The sensor network comprises a network bus, a transceiver connected with the network bus, a plurality of network nodes connected with the network bus, and a plurality of sensors. The sensors are connected with the network nodes, wherein the sensors monitor the internal environment conditions within the container, and provide data to the network nodes related to the internal environmental conditions.

In a further aspect, the invention comprises a method for monitoring an internal environmental condition within a container as the container travels through a fabrication facility. The method comprises the steps of monitoring with a sensor the internal environmental condition within the container, generating data related to the monitored condition, and transmitting the data to a remote location.

BRIEF DESCRIPTION OF THE DRAWINGS

The present invention will now be described with reference to the figures, in which.

DETAILED DESCRIPTION

Embodiments of the present invention are described hereinafter with respect to SMIF pods for carrying semiconductor wafers within a semiconductor wafer fabrication process. However, it is understood that embodiments of the present invention may be used with transportable containers other than SMIF pods. For example, embodiments of the present invention may be used with unsealed semiconductor lot boxes, pods for transporting workpieces other than semiconductor wafers, such as, for example, reticles and flat panel displays, etc. It is further understood that embodiments of the present invention comply with and allow compliance with all applicable SEMI standards. However, it is contemplated that alternative embodiments of the present invention not comply with the SEMI standards.

Figure 2:
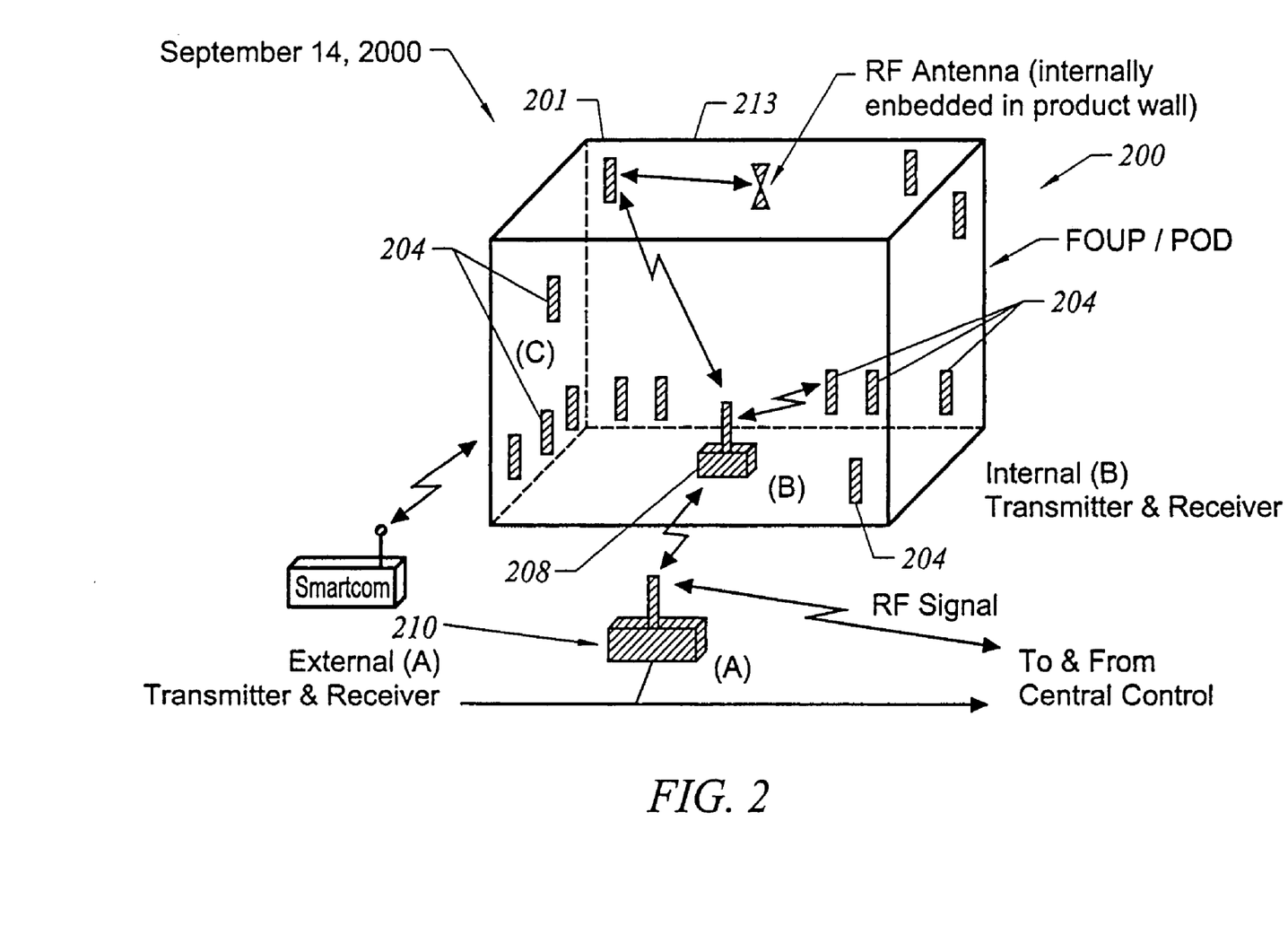
FIG. 2 is a schematic perspective view of a pod including an internal sensor network, in accordance with an embodiment of the present invention.

FIG. 2 illustrates a block diagram of an embodiment of a transportable pod monitoring system 200 including a transportable pod 201, and an internal sensor network 202. Various embodiments of transportable pod monitoring system 200 provide non-invasive, continuous local and/or remote sensing of internal environmental conditions of transportable pods. The transportable pod 201 of FIG. 2 may be any type of pod, such as a bottom opening pod, a front opening pod, etc. As indicated above, the type of transportable container is not critical to embodiments of the present invention, and other transportable containers, pods, SMIF or otherwise, may be used. The size of the workpieces transported within the pod may also vary in alternative embodiments, but may be for example, 200 mm wafers or 300 ml wafers.

The internal sensor network 202 includes sensors 204, each of which are contained or attached to transportable pod 201, an onboard power supply 406 (FIG. 4) for providing power to the various sensors, and an internal transceiver 208 for receiving and forwarding data from sensors 204. In an embodiment, internal transceivers may include memory (not shown) for storing data received from the sensors. The transportable pod monitoring system 200 may also include an external transceiver 210 for receiving and forwarding data from internal transceiver 208. As explained hereinafter, internal transceiver 208 may be omitted in alternative embodiments. Additionally, external transceiver 210 may be configured as part of a host computer 418 (FIG. 4).

Figure 3:
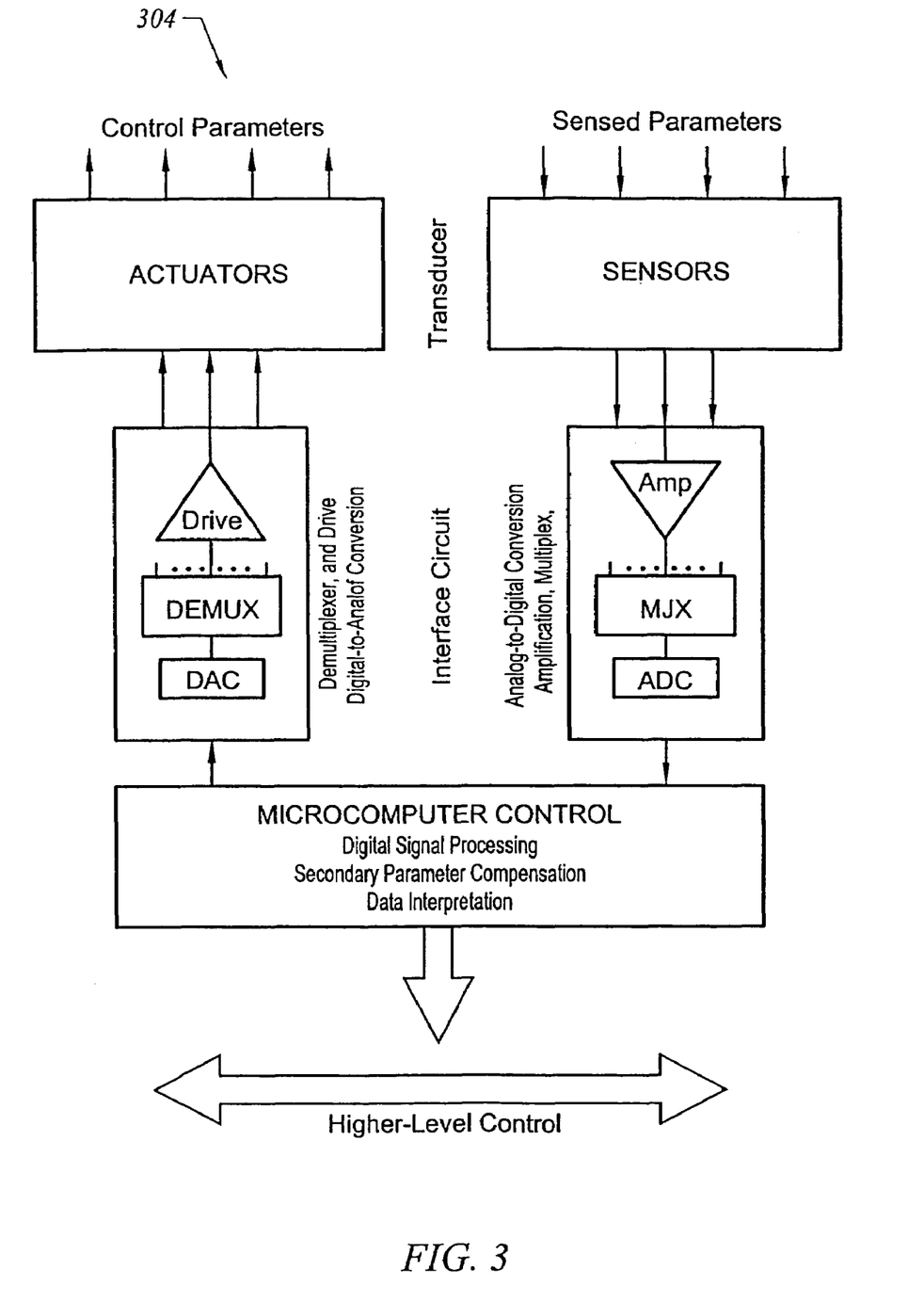
FIG. 3 is a block diagram of a generic sensor utilizing microelectromechanical technology.

Each of the sensors 204 may be of a known construction and may range from relatively simple analog sensors to more complex sensors operating according to microelectromechanical ("MEMS") technology. More complex sensors may include those that combine transducer-sensing elements with Digital Signal Processing ("DSP") to provide embedded sampling, analyzing, and reporting of data all within the sensor 204. Examples of such sensors may be those used for photo spectroscopy, gyroscopic orientation, image sensing, chemical sensing and residual gas analysis. A block diagram of an embodiment of a sensor 304 utilizing MEMS technology is shown in FIG. 3. Additionally, sensors may include memory for storing information.

Sensors 204 may be distributed around transportable pod 201 in a variety of configurations. Sensors 204 may be mounted to an internal portion of the transportable pod shell 213 in such a way as not to interfere with the wafers seated within transportable pod 201 or with wafer transfer into or out of pod 201. It is also contemplated that more than one sensor 204, or sensor inputs, may be provided for sensing a single internal environmental characteristic at different positions or regions within transportable pod 201.

Figure 4:
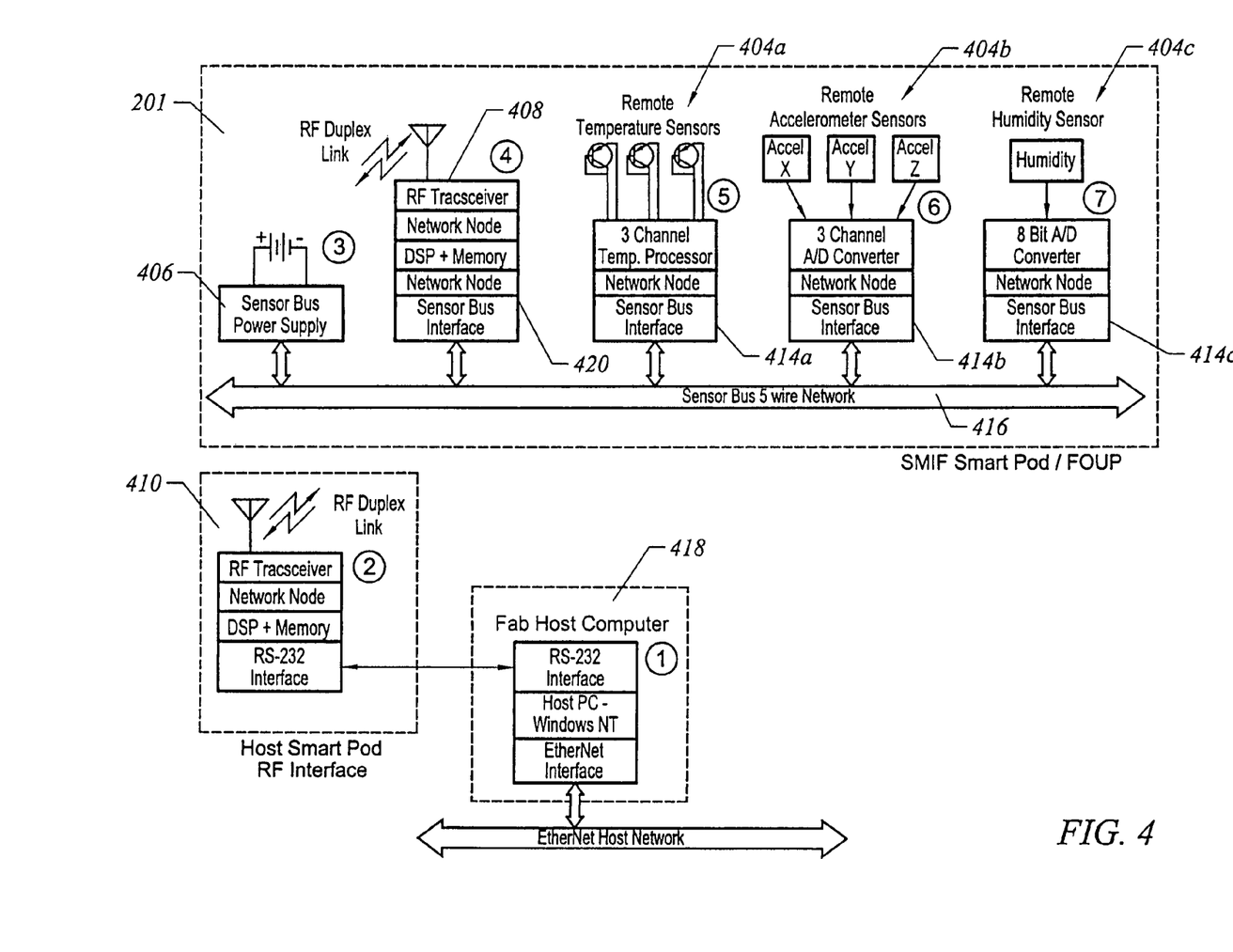
FIG. 4 is a block diagram of a system architecture, according to an embodiment of the present invention; and, FIG. 5 is a block diagram of a wafer fabrication facility that includes an embodiment of a transportable pod monitoring system.

FIG. 4 is a block diagram illustrating an embodiment of a sensor network 401. It is understood that various control network protocols may be employed to gather information from the various sensors and transmit the information to a remote location, such as a fabrication host computer 418. In one embodiment, the control network may be implemented by LonWorks® from Echelon®. Such a system utilizes a plurality of nodes 414a, 414b, 414c positioned within transportable pod 201. The nodes tie the various sensors 404a, 404b, 404c, power supply 406 and internal transceiver 408 to each other via a network bus 416. Servers 404a–404c are similar to and relate to sensors 204 illustrated in FIG. 2. Likewise, internal transceiver 404 corresponds to internal transceiver 208 of FIG. 2.

Sensors 404a–404c include a temperature sensor 404a for sensing temperature, an accelerometer 404b for sensing shock and vibration, and a humidity sensor 404c for sensing relative humidity within transportable pod 201. This embodiment is merely exemplary, and transportable pod 201 may include fewer sensors or may include several additional sensors in combination with all, some, or none of, sensors 404a–404c, for sensing various other internal environmental characteristics.

Temperature sensor 404a may be an analog or digital temperature sensor mounted to the interior of pod 201. It is understood that more than one such sensor may be used to determine whether temperature gradients occur within pod 201. If sensor 204a is an analog sensor, an analog-to-digital converter may be provided for converting the sampled analog temperature to a digital representation. Alternatively, a digital temperature sensor may be used. For example, an MIC384 Three Zone Thermal Supervisor from Micrel, Inc., San Jose, Calif. 95131 may be used. Such a sensor has a small, low cost package including an on board processor and memory. The sensor 404a may further include additional channels for sensing temperature in different regions of pod 201. Each channel may be positioned in different locations within pod 201 for sensing temperature in different regions.

Temperature sensor 404a is tied to node 414a, which may include a processor, such as a Motorola® Neuron 3150, and a sensor bus interface, such as an Echelon® FTT-10A twisted pair transceiver, for transferring the information from temperature sensor 404a to the network bus 416.

Accelerometer 404b may be provided for detecting both shock and vibration within transportable pod 201. An example of such a sensor 404b for use with an embodiment of the present invention is a single axis accelerometer with analog output, model No. MX1010C from MEMSIC, Inc., Andover, Mass. 01810. Such sensors are capable of sensing acceleration along an axis from 1 milli-g to 10 g and converting the measurement to a digital signal via an on board analog-to-digital converter. Sensor 404b may include additional channels allowing shock and vibration to be sensed along other axes, respectively, within the pod. It is understood that other sensors may be used for sensing shock and vibration. For example, known piezoelectric sensors which convert acceleration into a measurable voltage may also be used.

Accelerometer 404b is tied to a node 414b, which preferably includes a processor, such as a Motorola® Neuron 3150, and a sensor bus interface, such as an Echelon® FTT-10A twisted pair transceiver, for transferring the information from accelerometer 404b to network bus 416.

An embodiment of the present invention may also include a humidity sensor 404c. Humidity sensor 404c may be an analog or digital sensor mounted to the shell of pod 201. One example of a digital humidity sensor 404c for use with an embodiment of the present invention is an HIH series relative humidity sensor manufactured by Honeywell, Morristown, N.J. 07962. Humidity sensor 404c includes a single channel for sensing the humidity within the pod. Alternative humidity sensors may include additional channels for sensing humidity in different regions of pod 201.

Humidity sensor 404c is tied to node 414c, which preferably includes a processor, such as a Motorola® Neuron 3150, and a sensor bus interface, such as an Echelon® FTT-10A twisted pair transceiver, for transferring the information from humidity sensor 404c to network bus 416.

As indicated above, pod 201 may include additional analog or digital sensors for sensing other conditions within pod 201 (e.g.: pressure, gas composition, airborne particles, electrostatic buildup, light exposure, vibration, electromagnetic radiation, oxidation change of wafers, electrolysis, etc.), each of which may be connected to the network via a network node. Pod 201 may also include sensors for determining its location within the fabrication facility. Location sensors may utilize a global positioning system ("GPS"), internal tracking system, or other types of location tracking techniques.

Pod 201 may also include a reset mechanism, for clearing data gathered by the sensors, and returning the sensors to a neutral state. The reset mechanism may be, for example, a mechanical switch mounted on pod 201, a software reset program provided by the host computer 418 or internally included in the sensor network 201, or the sensors may reset automatically at a predetermined location within the fabrication facility, or upon the occurrence of a predetermined event, such as a pod cleaning. Additionally, the reset may be applied to any combination of the sensors, and not all sensors need be reset.

Power supply 406 supplies power to each sensor 404a–404c, sensor nodes 414a–414c, and internal transceiver 408. The power supply 406 may be mounted to an outside surface of the pod shell and connected to the various sensors via a network bus 416. Power supply 406 may alternatively be mounted within transportable pod 201. Power supply 406 may be of known construction, and may include, for example, a compact power source such as a rechargeable battery or a nine-volt alkaline battery. The power supply may further include a regulation circuit, as is known in the art. In an embodiment, one or more sensors may include onboard power supplies, thus reducing the need for power supply 406 or allowing power supply 406 to be omitted altogether.

The power supply 406 may provide power via network bus 416 to each of the sensor nodes as required by the various nodes and sensors. Alternatively, power supply 406 may be tied to a node 414a–414c as described above to include the power supply 406 within the sensor network, thus allowing the monitoring and control of the power supply 406.

Internal transceiver 408 may be located anywhere on or within transportable pod 201, and communicates with external transceiver 410. Internal transceiver 408 may communicate with external transceiver 410 using any type of wireless data transfer. For example, communication may be made using electromagnetic radiation, such as infrared (about $10^{13}$ Hz to about $10^{14}$ Hz), radio waves (about 3 kHz to about 300 GHz) (e.g.: Frequency Modulated ("FM"), Amplitude Modulated ("AM"), radar, Radio Frequency ("RF"), Personal Communication Services ("PCS"), etc.) and very low frequencies (i.e., about 0 to about 3 kHz). RF system embodiments may use analog, Code Division Multiple Access ("CDMA"), Time Division Multiple Access ("TDMA"), Cellular Digital Packet Data ("CDPD"), or any other RF transmission protocol.

Transceiver 408 may be tied to sensor network 401 via a bus master 420. Network nodes 414a–414c may be configured as a master-slave network, wherein bus master 420 functions as a gateway or router receiving data from each of the sensor nodes 414a–414c and forwarding the information to external transceiver 410. In an alternative embodiment, the individual nodes may be sufficiently sophisticated so that the network can be configured as a pier-to-pier network. In this embodiment, transceiver 408 and bus master 420 may be omitted and each of the individual sensor nodes 414a–414c would communicate directly with external transceiver 410 using any of the above electromagnetic radiation frequencies.

Bus master 420 incorporates back-to-back network nodes 414a–414c to form a gateway or router passing information through a data collection and a Digital Signal Processor ("DSP") such as, for example, model TMS 320C30 by Texas Instruments®.

Transmission of data to external transceiver 410, whether it is transmitted from internal transceiver 408, or directly from the sensors 404a–404c, may be transmitted constantly or intermittently. If the data is transmitted intermittently, it may be stored, either within the sensor's memory, or within the memory of internal transceiver 408 and delivered in packets using, for example, CDPD techniques.

Alternatively, data may only be transmitted if the corresponding internal environmental conditions are outside of a predefined desired operating range. In such an embodiment, the data itself may be transmitted or just an alert signal may be transmitted, thereby identifying that an internal characteristic within the pod is outside the desired operating range. In an embodiment, an audible alarm may be activated, thereby alerting the fabrication facility operators that an internal environmental condition for pod 201 is not within the desired operating range.

Additionally, if sensor data is stored on a memory within said pod 201, the data may be read by a computer at a later time to determine the type of environment condition which exceeded the operating range, and also information regarding the time and location within the facility where the contamination occurred.

In another embodiment, data is transmitted from pod 201 in response to an external request command. For example, host computer 418 (FIG. 4) sends status request commands to pod 201 at a predetermined time interval, such as every 10 seconds. In response to the status request commands pod 201 transmits the current sensor data to the host computer 418.

Some FOUPs currently operate with an IR tag or RF pill which is capable of receiving information regarding the various workpieces within the pod and relaying that information to fabrication host computer 418 to allow identification of the workpieces within a pod as they travel between the various stations within the fabrication facility. Such IR tags, and systems making use thereof, are described for example in U.S. Pat. Nos. 5,097,421, 4,974,166 and 5,166,884 to Maney et al. Such RF pills, and systems making use thereof, are described for example in U.S. Pat. Nos. 4,827,110 and 4,888,473 to Rossi et al., and U.S. Pat. No. 5,339,074 to Shindley. Each of the above-identified patents are assigned to the owner of the present invention, and each is incorporated by reference in its entirety herein.

In an alternative embodiment of the present invention, the IR tag or RF pill performs the functions of transceiver 408 to receive data from the various sensor nodes 414a–414c and relay that information to external transceiver 410 and/or host computer 418.

The various nodes 414a–414c and bus master 420 may be connected to each other via the network bus 416, which may comprise a micro 5-wire link bus capable of communicating power (+v, −v) and transmit and receive (tx, rx) signals, and which may include an electromagnetic protection shield. The network bus 416 may be a thin flexible ribbon, which is adhered to or embedded into the shell of transportable pod 201 during manufacturing with taps for the various nodes. Alternatively, the network bus 416, sensors 404, and internal transceiver 408 may be adhered to a currently-existing pod and hermetically sealed passages (herein referred to as "taps") for the various nodes created in the pod. Additional taps may also be formed in pod 201 to allow introduction of additional sensors at a later time. In embodiment, when a sensor is added, the portion of the sensor inserted into the tap punctures a membrane of the network bus 416, thereby adding the sensor to the sensor network.

Network bus 416 may pass through pod shell 213 at a tap to allow transfer of power and information signals between the interior and exterior of the pod. Network bus 416 is merely one example for connecting the various nodes in the sensor network. Alternative, communication protocols include electromagnetic frequencies, optical, or other means using known topologies such as star, loop, daisy-chain or free-type configurations.

As indicated above, FIG. 4 is merely one embodiment of the present invention for communicating information relating to internal pod characteristics to a fabrication host computer 418. It is understood that industry standard networks other than LonWorks® may be used to implement the sensor network 401, including for example a Controller Area Network ("CAN") bus or TCP/IP ethernet.

FIG. 4 further illustrates external transceiver 410 which is located remote from transportable pod 201, on for example, a load port assembly 507 (FIG. 5), a support surface on which transportable pod 201 is seated, mounted within a fabrication room 503a–503d (such as on the ceiling or wall), etc.

In an embodiment, each processing tool 505 may include an external transceiver 410 which receives information from internal transceiver 408. This information may then be relayed to host computer 418 via wired or wireless transmission, or processed locally. Due to the close proximity of internal and external transceivers when the pod is seated on the load port assembly, such an embodiment allows for the use of higher frequency transmission systems which typically deteriorate over long ranges of transmission. Additionally, in fabrication facilities which include several different fabrication rooms, often on several different floors or in different buildings, having an external transceiver 410 on the processing tool allows information to be relayed to host computer 418 (which may be located at a remote location or in one of the fabrication rooms) from each of the rooms and/or buildings.

Additionally, the external transceiver located on a processing tool may be in communication with the respective processing tool and if information is received from pod 201 that a contaminant has been introduced, the processing tool may immediately be deactivated without having to relay the information to a host computer 418. Immediately deactivating the processing tool may reduce the amount of contamination introduced to the processing tool and/or may also reduce the amount of contaminated wafers.

Internal transceiver 408 broadcasts to different external transceivers 410 as the transportable pod 201 including the internal transceiver 408 moves around the fabrication facility. External transceiver(s) 410 may be tied to a remote network node including a processor and bus interface as described above.

The information received by external transceiver 410 is passed to the network node through a data collection and DSP processor, such as for example model TMS 320C30 by Texas Instruments®. The remote network node may also include a standard RS-232 serial communication port to transfer the sensor information to the fabrication host computer 418. It is understood that various other known communication protocols may be used instead of an RS-232 interface in alternative embodiments, such as wireless transmission.

In an alternative embodiment, information may be relayed directly to host computer 418 from nodes 404a–404c, thereby eliminating the need for external transceiver 410.

Host computer 418 is configured to receive data from each transportable pod 201 within the fabrication facility. Host computer 418 may continuously cycle through data for each transportable pod 201, so that readings from a pod may be detected in real time.

In an alternative embodiment, host computer 418 is configured to poll pods 201, sending a status request command, as they travel through a fabrication process. In response to the polling, each pod 201 transmits information related to its condition and location. Actively polling the pods 201 provides an added security measure. If pod 201 does not respond to the poll, either the pod is defective or it is not within the communication range of host computer 201, or it has been removed from the fabrication facility.

Once data from a particular pod is received in host computer 418, host computer 418 may perform any of various operations. For example, if one or more of the measured internal pod characteristics are outside of an expected range, host computer 418 may direct that pod 201 be manually or automatically taken off-line and isolated for inspection. As the present invention provides pod internal environmental measurements in real time, a transportable pod 201 exhibiting abnormal readings can be quickly identified and isolated upon entry of the contaminant to the pod environment. Thus, the system according to an embodiment of the present invention prevents the spread of contamination by isolating a contaminated pod before it is exposed to other tools or workpieces.

It is a further advantage of the present invention that data from transportable pods can be used to gather information about individual process tools in the fabrication facility, and can also identify the source of a particular contaminant within the fabrication facility. If it is evident over time that pods frequently exhibit abnormal readings after processing at a particular tool, an embodiment of the present invention identifies this situation and the tool may be taken off-line for inspection and maintenance. While prior art systems allow for testing and monitoring of wafer lots, this is performed either by manually or automatically taking the pods to a metrology tool, where the pods are opened and the workpieces tested for contaminants. Not only do embodiments of the present invention perform such testing on a continuous basis, they do so in a non-invasive manner without having to open the pods and without slowing the processing throughput of the wafer lot.

Host computer 418 can also store the data from a particular pod along with that pod's identification and/or path through the fabrication facility. This data can be used for statistical process control by showing how a pod and/or a process tool performs over time. Fabrication facility operators can use this information to statistically identify when pod/tool maintenance is required, as well as identify how well a pod/tool is performing relative to others. This information may also be used for security measures for tracking the location of pod 201.

Host computer 418 may additionally be connected to an Intranet or Internet network via a standard ethernet connection. Thus, pod and tool performance from one fabrication facility can be monitored and controlled in real time by an operator who may be thousands of miles away. This connection also gives an operator the ability to compare pod and tool performance across a large number of semiconductor wafer fabrications.

In an embodiment of the present invention, the sensor network provides data as to the internal environmental characteristics of a sealed pod as it travels through the semiconductor fabrication process. However, in an alternative embodiment, the present invention may be used to sense the internal environmental characteristics of a load port minienviroment on which a pod is seated. In particular, as explained in the Background of the Invention section, in order to transfer workpieces between a pod and a process tool, the pod is loaded onto a load port, which separates the pod door from the pod shell to provide access to the workpieces therein. The pod shell is generally kept in position on the load port to seal the access port vacated by the port door. In accordance with this alternative embodiment, while positioned on the load port, the sensors in the pod shell can provide data relating to the internal environmental characteristics of the load port minienvironment and/or process tool to which the minienvironment is affixed.

FIG. 5 illustrates a typical fabrication facility 500, including an embodiment of a transportable pod monitoring system 200. Fabrication facility 500 may include a main corridor 501, and several processing rooms 503a, 503b, 503c, 503d, 503e, and 503f. Each processing room may contain one or more processing tools, such as processing tool 505. As discussed above, a processing tool 505 typically includes a load port assembly 507 for loading and unloading pods.

According to an embodiment of the present invention, the fabrication facility 500 includes a transportable pod monitoring system 200 (FIG. 2) for monitoring the movement of transportable pods, such as pod 511 throughout the fabrication facility 500. As discussed above, there are many different configurations which may be used to monitor transportable pod 511. For example, each processing room 503a–503f may include an external transceiver 510a which receives information transmitted from pods which are within that particular room. Alternatively, each load port assembly 507 may include an external transceiver, such as external transceiver 510b which receives information from a pod 511 which is located on that particular load port assembly 507. Additionally, an primary external transceiver, such as external transceiver 510c, located in main corridor 501 may be used to receive transmissions from all pods contained in fabrication facility 500.

Information received by external receivers 510a–510c may be transmitted to a host computer, such as host computer 520a located in the fabrication facility 500, or to a host computer 520b located at a remote location 525, which may be thousands of miles away.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A SMIF pod transportable container for semiconductor wafers or reticles having an internal environment isolated from ambient atmospheric conditions, comprising:
   a pod shell with one of a bottom opening and a front opening;
   a door that mates with said pod shell at said one of the bottom opening and the front opening;
   a sensor, monitoring a condition of said internal environment, and transmitting data related to said monitored condition;
   a second sensor, monitoring a condition of said internal environment within said transportable container, and transmitting data related to said monitored condition; and
   a power supply, providing power to said sensor.

2. A SMIF pod transportable container for semiconductor wafers or reticles having an internal environment isolated from ambient atmospheric conditions, comprising:
   a pod shell with one of a bottom opening and a front opening;
   a door that mates with said pod shell at said one of the bottom opening and the front opening;
   a sensor, monitoring a condition of said internal environment, and transmitting data related to said monitored condition; and
   wherein said sensor includes a plurality of sensor inputs positioned at respective distinct locations within said transportable container, each said sensor input monitoring said condition of said internal environment at said respective distinct locations within said container.

3. A SMIF pod transportable container monitoring system for monitoring an internal environmental condition of a transportable container having an internal environment isolated from ambient atmospheric conditions, the transportable container monitoring system comprising:
   a sensor, monitoring said internal environmental condition, and transmitting data representative of said monitored internal environmental condition;
   a transceiver in communication with said sensor, receiving and transmitting said transmitted data;
   wherein said transportable container is positioned on a processing tool, and wherein said transceiver is operatively connected with said processing tool; and
   wherein said transceiver provides said data to said processing tool, and said processing tool deactivates if said data is not within a desired operating range.

4. A SMIF pod transportable container monitoring system for monitoring an internal environmental condition of a transportable container having an internal environment isolated from ambient atmospheric conditions, the transportable container monitoring system comprising:
   a sensor, monitoring said internal environmental condition, and transmitting data representative of said monitored internal environmental condition;
   a transceiver in communication with said sensor, receiving and transmitting said transmitted data; and
   a second transceiver, at a location external to said transportable container, for receiving and transmitting said data transmitted by said transceiver.

5. The SMIF pod transportable container monitoring system of claim 4, further including: a host computer receiving and processing said data transmitted from said second transceiver.

6. The SMIIE pod transportable container monitoring system of claim 5, wherein said host computer is at a remote location relative to said transportable container.

7. The SMIF pod transportable container monitoring system of claim 5, wherein said host computer determines if said monitored internal environmental condition within said transportable container is within a desired operating range.

8. The SMIF pod transportable container monitoring system of claim 7, wherein said container is positioned on a processing tool, and wherein said host computer deactivates said processing tool if said internal environmental condition is not within said desired operating range.

9. A method for monitoring an internal environmental condition within a SMIF pod transportable container with one of a front opening door and a bottom opening door having an internal environment isolated from ambient atmospheric conditions, comprising the steps of:
   monitoring with a sensor, said internal environmental condition within said transportable container; generating data related to said monitored condition; transmitting said data;
   receiving said data at a location external to said SMIF pod transportable container; and
   processing said data to determine if said internal environmental condition is within a desired operating range.

10. The method of claim 9, wherein said step of monitoring includes monitoring a plurality of internal environmental conditions with a plurality of sensors.

11. The method of claim 9, wherein said data is transmitted using electromagnetic radiation.

12. The method of claim 9, wherein said electromagnetic radiation is in a frequence range between about 3 kHz to about 300 Ghz.

13. A method for monitoring an internal environmental condition within a SMIF pod transportable container with one of a front opening door and a bottom opening door having an internal environment isolated from ambient atmospheric conditions, comprising the steps of:
   monitoring with a sensor, said internal environmental condition within said transportable container; generating data related to said monitored condition; transmitting said data;
   determining whether said internal environmental condition is within a desired operating range; and
   alerting an operator if it is determined that said internal environmental condition is not within a desired operating range.

14. The method of claim 13, wherein said step of determining whether said internal environmental condition is within a desired operating range includes the step of:
   processing said data related to said internal environmental condition.

* * * * *

UNITED STATES PATENT AND TRADEMARK OFFICE
CERTIFICATE OF CORRECTION

| | | |
|---|---|---|
| PATENT NO. | : 7,156,129 B2 | Page 1 of 1 |
| APPLICATION NO. | : 11/146936 | |
| DATED | : January 2, 2007 | |
| INVENTOR(S) | : Jerry A. Speasl and Edward Dante | |

It is certified that error appears in the above-identified patent and that said Letters Patent is hereby corrected as shown below:

Col. 12, line 8, delete "SMIIE" and insert --SMIF--

Signed and Sealed this

Twenty-first Day of August, 2007

JON W. DUDAS
*Director of the United States Patent and Trademark Office*